United States Patent
Leiphart

(10) Patent No.: US 6,224,942 B1
(45) Date of Patent: May 1, 2001

(54) METHOD OF FORMING AN ALUMINUM COMPRISING LINE HAVING A TITANIUM NITRIDE COMPRISING LAYER THEREON

(75) Inventor: Shane P. Leiphart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/378,551

(22) Filed: Aug. 19, 1999

(51) Int. Cl.[7] .............................. B05D 1/36; B05D 3/00; C23C 14/14; C23C 14/16
(52) U.S. Cl. .................... 427/255.7; 427/99; 427/124; 427/250; 427/264; 427/270; 427/271; 427/405; 427/419.1; 427/419.7; 204/192.15
(58) Field of Search .................... 427/124, 250, 427/255.7, 264, 270, 271, 405, 419.7, 419.1, 99, 272; 204/192.1, 192.15; 438/708; 430/313, 318

(56) References Cited

U.S. PATENT DOCUMENTS

| | | | |
|---|---|---|---|
| 5,582,881 | * | 12/1996 | Besser et al. ................ 427/576 |
| 5,646,449 | * | 7/1997 | Nakamura et al. ........... 257/761 |
| 5,909,635 | * | 6/1999 | Marieb et al. ................ 438/625 |
| 5,925,227 | * | 7/1999 | Kobayashi et al. ....... 204/298.25 |
| 5,925,933 | * | 7/1999 | Colgan et al. ............... 257/762 |
| 6,010,965 | * | 1/2000 | Shields ....................... 438/700 |
| 6,028,003 | * | 2/2000 | Frisa et al. .................. 438/653 |

FOREIGN PATENT DOCUMENTS 4-34939 * 2/1992 (JP) .

* cited by examiner

Primary Examiner—Timothy Meeks
Assistant Examiner—Michael Barr
(74) Attorney, Agent, or Firm—Wells, St. John, Roberts, Gregory & Matkin P.S.

(57) ABSTRACT

The invention includes methods of forming aluminum containing lines having titanium nitride containing layers thereon, and preferably by physical vapor deposition. In one aspect, a first layer including at least one of elemental aluminum or an aluminum alloy is formed over a substrate. A second layer including an alloy of titanium and the aluminum from the first layer is formed. The alloy has a higher melting point than that of the first layer. A third layer including titanium nitride is formed over the second layer. The first, second and third layers are formed into a conductive line. In one aspect, a method of forming an aluminum containing line having a titanium nitride containing layer thereon includes physical vapor depositing a first layer having at least one of elemental aluminum or an aluminum alloy over a substrate. At least one of elemental titanium or a titanium alloy is physical vapor deposited on the first layer, and formed therefrom is a second layer comprising an alloy of titanium and the aluminum from the first layer. The alloy has a higher melting point than that of the first layer. A third layer comprising titanium nitride is physical vapor deposited over the second layer. The first, second and third layers are photopatterned into a conductive line.

9 Claims, 4 Drawing Sheets

METHOD OF FORMING AN ALUMINUM COMPRISING LINE HAVING A TITANIUM NITRIDE COMPRISING LAYER THEREON

TECHNICAL FIELD

This invention relates to methods of forming aluminum comprising lines having a titanium nitride comprising layer thereon.

BACKGROUND OF THE INVENTION

Conductive metal lines and contacts are two of the many components typically fabricated in semiconductor processing of integrated circuitry. One example process of doing so, and problems associated therewith, is described with reference to FIG. 1. There illustrated is a semiconductor wafer fragment 10 comprised of a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. An exemplary insulating layer 14 is formed over substrate 12. A titanium layer 16 is formed over layer 14. An example thickness for layer 16 is 400 Angstroms. An aluminum or aluminum alloy layer 18 is formed over layer 16. An example thickness is 6000 Angstroms.

Metal layers 16 and 18 in one aspect of the prior art can be conventionally deposited using physical vapor deposition semiconductor processing tools, such as the Applied Materials Endura 5500™ physical vapor deposition tool. Such a tool comprises multiple processing chambers within which various processing, such as pre-clean, deposition and cooling, are conducted. For example, titanium layer 16 could be deposited in a processing chamber of the tool having a titanium sputtering target received therein. Layer 18 would typically likewise be deposited in another chamber having an aluminum or an aluminum alloy sputtering target received therein. Layer 18 might also be deposited in one or multiple depositions in the same or different aluminum deposition chambers. Typically, a lattermost of such depositions, where multiple depositions are conducted, includes a high temperature sputter deposition at a temperature of, for example, 450° C.

After the aluminum deposition, the wafer is typically moved to another chamber for deposition of a titanium nitride comprising layer 20. An example thickness for layer 20 is from about 150 Angstroms to about 250 Angstroms. Layer 20 is typically provided to function as an antireflective coating layer which facilitates subsequent photolithographic processing. However, it has been discovered that defects in the form of bright, circular areas or formations 22 have been forming atop layer 20 when viewed by a scanning electron microscope. These defect areas 22 have been determined to be one or combination of aluminum or aluminum oxide apparently resulting from migration of aluminum from layer 18 through cracks formed in layer 20 which exist at least during its deposition. Formation of these defect regions 22 is undesirable. It has been surmised the aluminum migrates through cracks in layer 20.

A prior art solution to the existing problem has been to position the wafer into a dedicated cooling chamber within the processing tool prior to conducting the titanium nitride deposition in a different chamber. However, the cooling takes a considerable amount of time, and effectively lengthens the amount of time it ultimately takes to process a batch of wafers utilizing the processing tool.

Accordingly, it would desirable to develop alternate methods of eliminating or at least reducing formation of defect regions 22, preferably without appreciably significantly increasing the overall processing time for a batch of wafers.

SUMMARY

The invention includes methods of forming aluminum containing lines having titanium nitride containing layers thereon, and preferably by physical vapor deposition. In one aspect, a first layer including at least one of elemental aluminum or an aluminum alloy is formed over a substrate. A second layer including an alloy of titanium and the aluminum from the first layer is formed. The alloy has a higher melting point than that of the first layer. A third layer including titanium nitride is formed over the second layer. The first, second and third layers are formed into a conductive line. In one aspect, a method of forming an aluminum containing line having a titanium nitride containing layer thereon includes physical vapor depositing a first layer having at least one of elemental aluminum or an aluminum alloy over a substrate. At least one of elemental titanium or a titanium alloy is physical vapor deposited on the first layer, and formed therefrom is a second layer comprising an alloy of titanium and the aluminum from the first layer. The alloy has a higher melting point than that of the first layer. A third layer comprising titanium nitride is physical vapor deposited over the second layer. The first, second and third layers are photopatterned into a conductive line.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
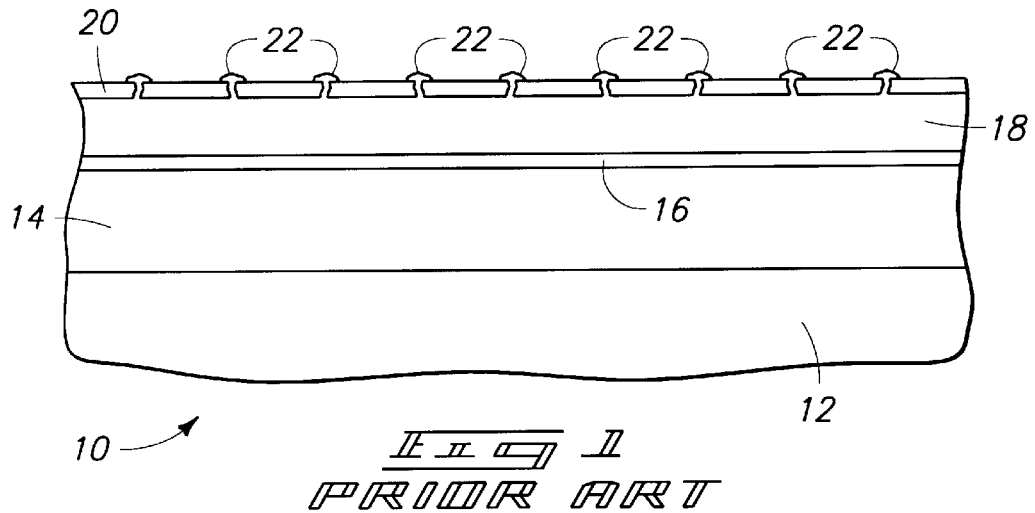
FIG. 1 is a diagrammatic sectional view of a semiconductor wafer fragment processed in accordance with the prior art, and is discussed in the "Background" section above.
Figure 2:
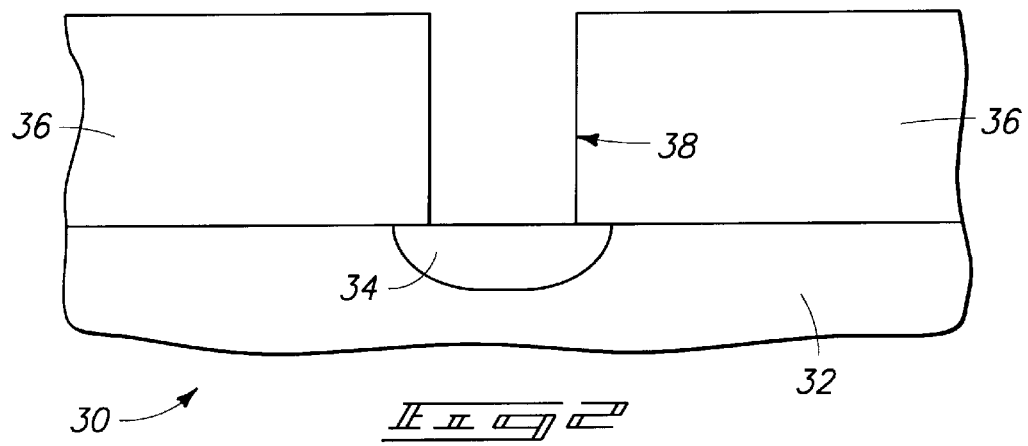
FIG. 2 is a diagrammatic sectional view of a semiconductor wafer fragment at one processing step in accordance with an aspect of the invention.
Figure 8:
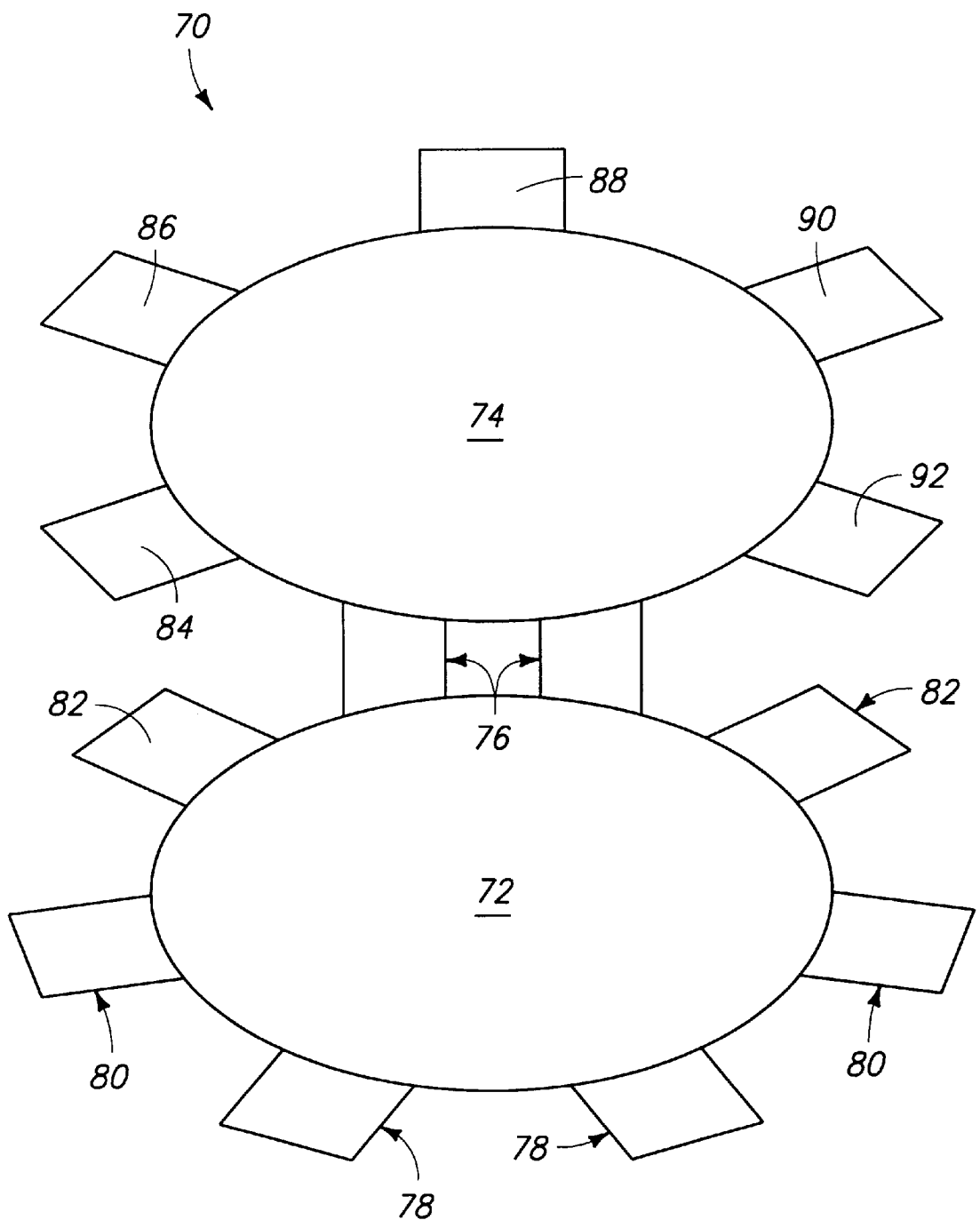
FIG. 8 is a diagrammatic plan view of a semiconductor wafer processor utilizable in fabrication of the exemplary semiconductor wafer depicted in the FIGS. 2–7 embodiment.

Referring initially to FIG. 2, a semiconductor wafer fragment in process is indicated generally with reference numeral 30. Such comprises a bulk monocrystalline silicon substrate 32 having a diffusion region 34 formed therein. An insulating layer 36 has been formed thereover, with a contact opening 38 having been formed therethrough to diffusion region 34. In accordance with a most preferred aspect of the invention, processing would then be conducted for deposition of subsequent metal layers in a physical vapor deposition semiconductor processing tool, such as tool 70 depicted in FIG. 8. Such comprises an example processing tool, such as the Applied Materials Endura 5500™ system. Alternate processing tools are, of course, usable. The depicted system 70 comprises a buffering high vacuum chamber 72 and an ultra-high transfer chamber 74. Such are interconnected by selectively openable and closable pass-through sections 76. Buffer chamber 72 is connected with a pair of load-lock chambers 78 within which a plurality of wafers for processing can be received. A pair of degassing chambers 80 are also associated with buffer chamber 72. Wafers, prior to depositions using the tool, can be processed here to remove water or other materials therefrom. Another pair of pre-clean or deposition chambers 82 are also associated with buffer chamber 72. Pre-cleaning of the wafers prior to transfer through one of passthroughs 76 to transfer chamber 74 can occur here, such as sputter cleaning using an inert gas.

Transfer chamber 74 is shown as having five discrete processing chambers 84, 86, 88, 90, and 92 associated therewith. Their exemplary functions and operations in accordance with best mode principles of the invention are described relative to the processing of the exemplary embodiment wafer from FIGS. 2 through 6.

Figure 3:
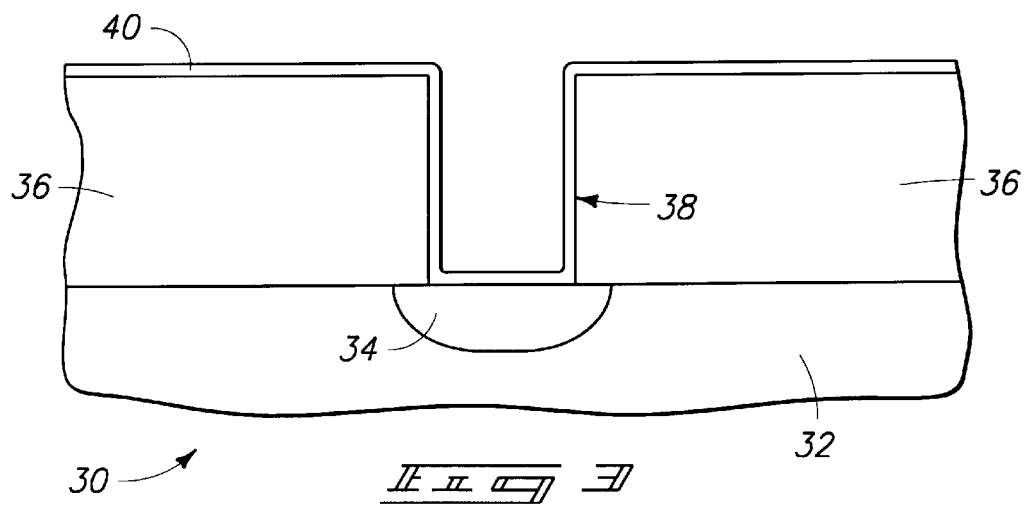
FIG. 3 is a view of the FIG. 2 wafer at a processing step subsequent to that shown by FIG. 2.

Referring to FIG. 3, the FIG. 2 wafer is positioned within chamber 84 (FIG. 8) for deposition of a titanium layer 40. Deposition of layer 40 is preferred to provide silicide formation (not shown) in contact opening 70 at the interface with silicon material 32/34. Further, such titanium layer provides a wetting layer to subsequently deposited metal layers. The deposition in the depicted tool would be by physical vapor deposition (i.e., sputtering) using a titanium target. An example would be to provide 2500 watts of power on the target, argon flow of 35 sccm at ambient temperature, and a pressure of 1.5 mTorr. An exemplary deposition time is for 15 seconds to produce a layer 40 having a thickness of approximately 400 Angstroms.

The FIG. 3 wafer would then be removed from chamber 84 and positioned within chamber 86. Chamber 86 preferably includes an elemental aluminum or an aluminum alloy target therein. A layer comprising at least one of elemental aluminum or an aluminum alloy is then physical vapor deposited over the substrate. The wafer is then preferably removed from chamber 86 and positioned within another aluminum deposition chamber 88. Physical vapor deposition of aluminum within chamber 88 is then conducted at a higher temperature, with the desired goal being the ultimate production of a layer 42 (FIG. 4) having an exemplary thickness of 6000 Angstroms. In the context of this document, layer 42 is referred to as a first layer, and most preferably consists essentially of elemental aluminum, an aluminum alloy or a mixture thereof. Exemplary processing for both the chamber 86 and chamber 88 depositions include argon flow of from 15 to 50 sccm and pressure at from 0.5 to 5 mTorr. Temperature during the first chamber 86 deposition is preferably at 100° C. or less, while temperature during deposition in chamber 88 is at 400° C., and more preferably at 450° C. or greater. Power during the first chamber 86 deposition is preferably at from 10,000 Watts to 15,000 Watts, while power during the second chamber 88 deposition if preferably at from 1000 watts to 2000 watts. Thus, an outermost portion of layer 42 is preferably deposited at a temperature of at least about 400° C., and more preferably at a temperature of at least about 450° C.

Figure 4:
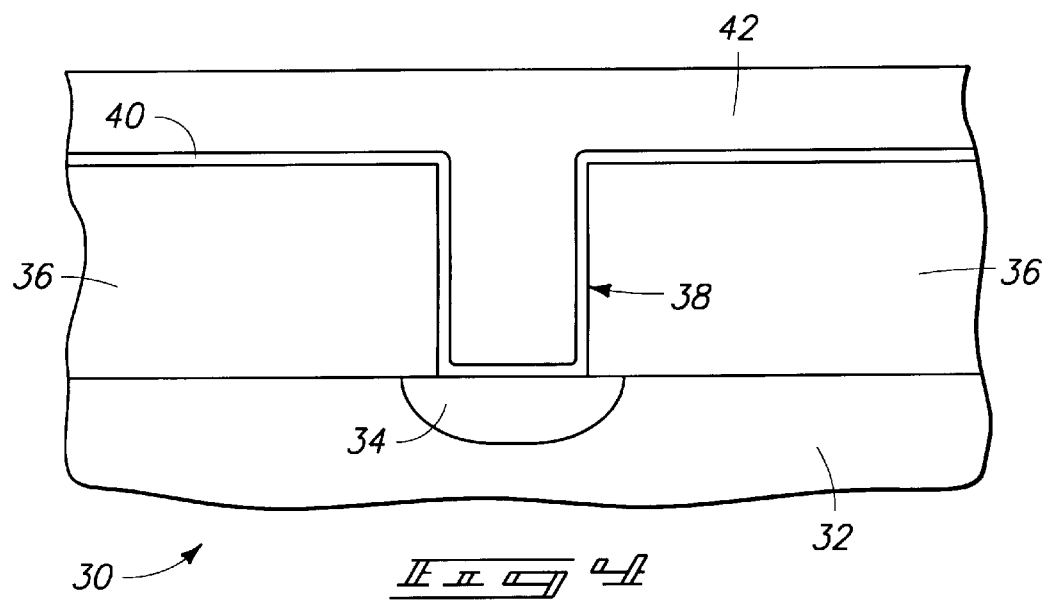
FIG. 4 is a view of the FIG. 2 wafer at a processing step subsequent to that shown by FIG. 3.
Figure 5:
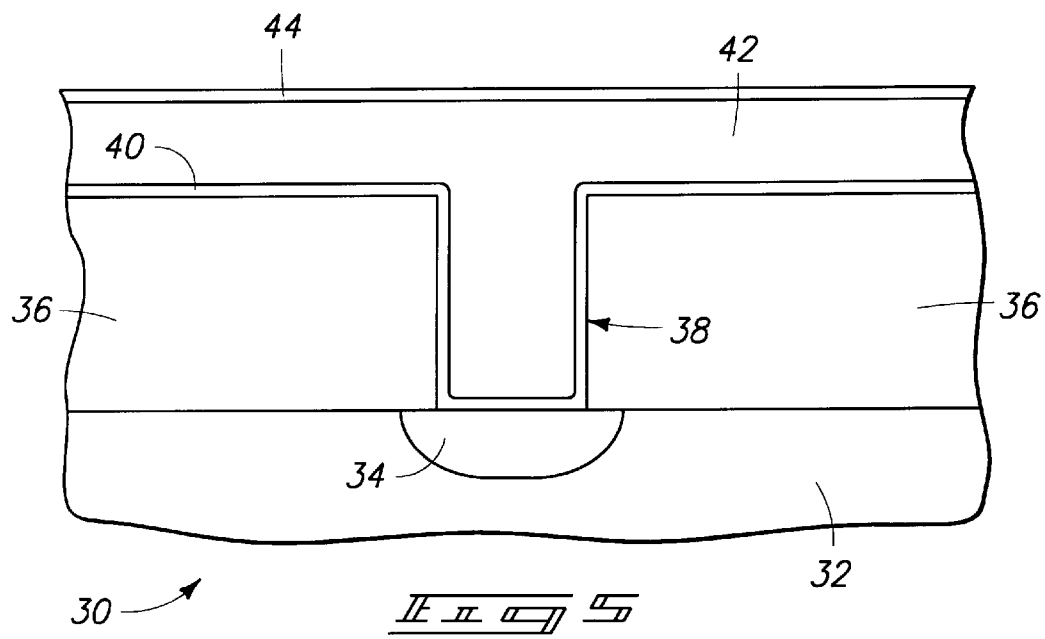
FIG. 5 is a view of the FIG. 2 wafer fragment at a processing step subsequent to that shown by FIG. 4.

The FIG. 4 wafer is removed from chamber 88 and positioned within another deposition chamber 90. Here, at least one of elemental titanium or a titanium alloy is physical vapor deposited on first layer 42, and a second layer 44 (FIG. 5) is formed therefrom to comprise an alloy of the depositing titanium and aluminum from first layer 42. Preferably, alloy second layer 44 forms during and upon contact by the titanium deposition. Further preferably, essentially all of the titanium deposited alloys with aluminum of first layer 42. An example and preferred thickness for layer 44 is from about 50 Angstroms to about 150 Angstroms, and even more preferably from about 100 Angstroms to about 200 Angstroms. Greater deposition thicknesses are of course possible, with a less desired result being ultimate formation of a thicker line layer and possibly an elemental titanium layer being received over the titanium aluminum alloy layer 44. Example deposition conditions for layer 44 include a titanium target powered at 1000 watts, argon gas flow rate at 35 sccm, ambient steady state temperature, and a pressure of 1.5 mTorr to provide a preferred deposition thickness of from about 100 Angstroms to about 200 Angstroms.

Where deposition is conducted as typical within chamber 90 as soon as removing the wafer from chamber 88, the wafer will typically not have cooled down by much more than 25° C., and perhaps less. Accordingly, at least an outer portion of first layer 42 in such circumstances will have a temperature of at least about 360° C. during the physical vapor depositing of titanium to form titanium-aluminum alloy layer 44. However, titanium and aluminum will form an alloy having a significantly higher melting point than that of first layer 42, and thus preferably effectively form a shield to migration of aluminum through layer 44 during or after it's formation, particularly where subsequent processing occurs at temperatures below the melting point of titanium-aluminum alloy layer 44.

Figure 6:
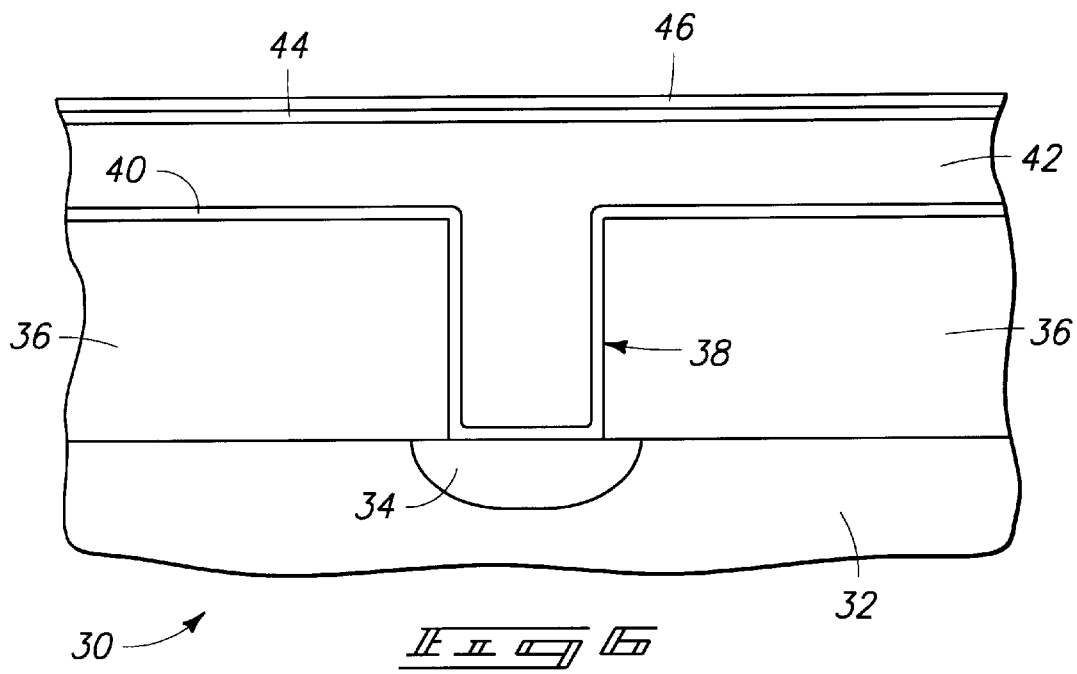
FIG. 6 is a view of the FIG. 2 wafer fragment at a processing step subsequent to that shown by FIG. 5.

Referring to FIG. 6, a third layer 46 comprising titanium nitride is physical vapor deposited over and preferably on (i.e., in contact with) second layer 44. Such processing, preferably is conducted in the same processing chamber 90 within which layer 44 was formed. Such will also thereby typically be conducted while at least an outer portion of layer 42 is at a temperature of at least 360° C. An example and preferred thickness for layer 46 is from about 150 Angstroms to about 250 Angstroms. Example deposition conditions for forming layer 46 include 6000 watts of power on a titanium target within chamber 90, an $N_2$ or other nitrogen containing gas flow rate of 35 sccm, argon flow rate of 15 sccm, ambient steady state temperature, and a pressure of 2.0 mTorr. Accordingly in the preferred embodiment, physical vapor deposition of titanium to form layer 44 and the physical vapor deposition to form third layer 46 occur in the same deposition chamber, and without moving the substrate therefrom intermediate the elemental titanium and third layer depositions. Alternately but less preferred, such depositions could be conducted in different chambers.

Subsequently, the FIG. 6 wafer would be removed from deposition chamber 90 and inserted in a cooling chamber 92. Example cooling would be to flow argon gas therethrough at room temperature for from 45 seconds to 60 seconds. Thereafter, the substrate would be removed from processing chamber 92, through one of passageways 76, and ultimately out of buffer chamber 72 through one of load-lock chambers 78. Accordingly, the substrate is ultimately removed from processing tool 70.

Figure 7:
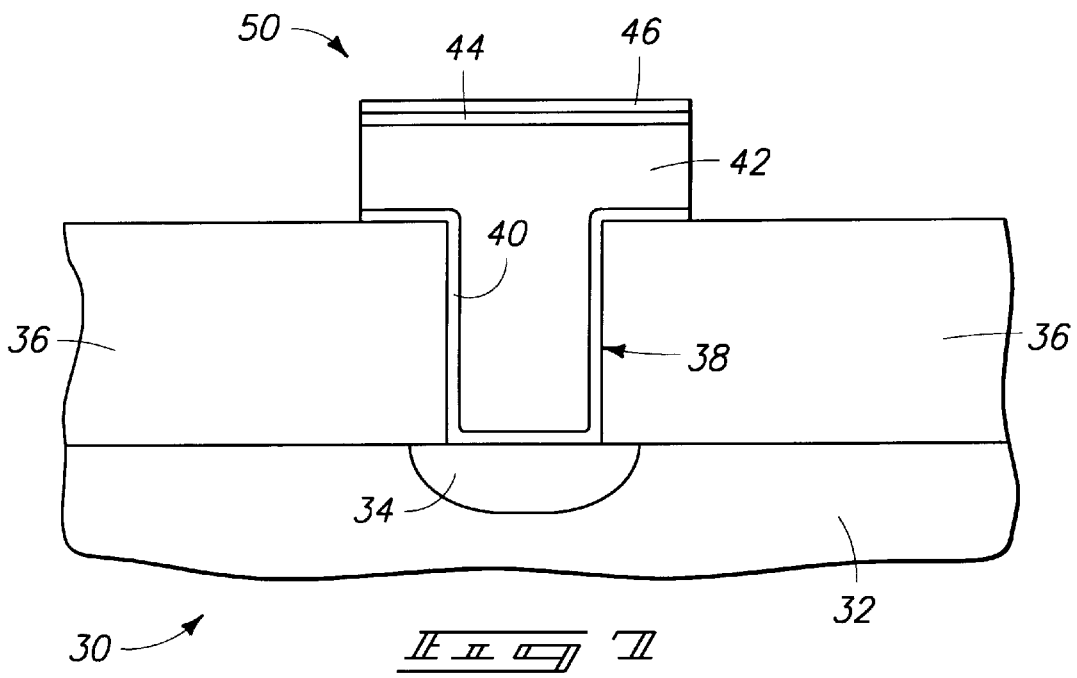
FIG. 7 is a view of the FIG. 2 wafer fragment at a processing step subsequent to that shown by FIG. 6.

Referring to FIG. 7, layers 46, 44, 42 and 40 are preferably photopatterned (i.e., using photolithography) to form a conductive line 50 having a contacting plug therebelow making electrical connection with diffusion region 34. Thus by way of example only, an aluminum comprising line having a titanium nitride comprising layer thereon is fabricated.

Consider, by way of example only, one alternate processing using processing tool 70. The wafer after completion of processing in chamber 88 could be moved back into chamber 84, with the next new wafer to be processed waiting in one of the pass-through chambers 76. Third layer 46 could be deposited onto the substrate within chamber 84. Further, one or both of pass-through chambers 76 could be used as cooling chambers.

The above-described and preferred processing is all associated with physical vapor deposition, and preferably in a single processing tool for fabrication of the metal layers over the substrate, and further using subsequent photopatterning. However, the invention also contemplates other methods of forming the depicted and described first, second and third layers, such as by way of example only, chemical vapor deposition or other techniques developed or yet to be developed. Further, existing or to-be-developed processing other than photopatterning could be used to form an ultimate desired line shape.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an aluminum comprising line having a titanium nitride comprising layer thereon, the method comprising:

in a processing tool, physical vapor depositing a first layer comprising at least one of elemental aluminum or an aluminum alloy over a substrate in a first chamber;

physical vapor depositing at least one of elemental titanium or a titanium alloy on the first layer in a second chamber of the processing tool while at least an outer portion of the first layer is at a temperature of at least about 360° C., and forming therefrom a second layer comprising an alloy of titanium and the aluminum from the first layer in the second chamber during said depositing, the alloy having a higher melting point than that of the first layer, and wherein essentially all the physical vapor deposited titanium alloys with the aluminum of the first layer;

physical vapor depositing a third layer comprising titanium nitride on the second layer in the processing tool;

removing the substrate from the processing tool after depositing the third layer; and forming the first, second and third layers into a conductive line.

2. The method of claim comprising depositing the second layer to have a thickness of from about 50 Angstroms to about 150 Angstroms.

3. The method of claim 1 comprising depositing the second layer to have a thickness of from about 100 Angstroms to about 200 Angstroms.

4. The method of claim 1 wherein the first layer consists essentially of elemental aluminum, an aluminum alloy, or a mixture thereof.

5. The method of claim 1 wherein the first layer consists essentially of elemental aluminum.

6. The method of claim 1 wherein the physical vapor depositing at least one of elemental titanium or a titanium alloy comprises physical vapor depositing elemental titanium.

7. The method of claim 1 wherein temperature of at least an outer portion of the first layer is at least about 360° C. during the physical vapor depositing of the third layer.

8. The method of claim 1 wherein the third layer physical vapor depositing occurs in the second chamber of the processing tool.

9. The method of claim 1 wherein the physical vapor depositing of at least one of elemental titanium or a titanium alloy on the first layer in the second chamber of the processing tool comprises physical vapor depositing a titanium alloy layer, and forming therefrom a second layer comprising an alloy of titanium and the aluminum from the first layer in the second chamber during said depositing.

* * * * *

UNITED STATES PATENT AND TRADEMARK OFFICE
CERTIFICATE OF CORRECTION

PATENT NO. : 6,224,942 B1              Page 1 of 1
DATED : May 1, 2001
INVENTOR(S) : Shane P. Leiphart It is certified that error appears in the above-identified patent and that said Letters Patent is hereby corrected as shown below:

<u>Column 6,</u>
Line 17, replace "claim comprising" with -- claim 1 comprising --.

Signed and Sealed this

Twenty-eighth Day of August, 2001

*Attest:*

*Nicholas P. Godici*

*Attesting Officer*

NICHOLAS P. GODICI
*Acting Director of the United States Patent and Trademark Office*